United States Patent [19]
Joardar et al.

[11] Patent Number: 5,475,255
[45] Date of Patent: Dec. 12, 1995

[54] CIRCUIT DIE HAVING IMPROVED SUBSTRATE NOISE ISOLATION

[75] Inventors: Kuntal Joardar, Chandler, Ariz.; Jeffrey D. Ganger; Sangil Park, both of Austin, Tex.

[73] Assignee: Motorola Inc., Schaumburg, Ill.

[21] Appl. No.: 268,744

[22] Filed: Jun. 30, 1994

[51] Int. Cl.$^6$ ............................ H01L 27/06; H01L 29/41
[52] U.S. Cl. ...................... 257/547; 257/659; 257/394; 257/901
[58] Field of Search .................................. 251/659, 484, 251/452, 409, 503, 547, 688, 901, 394

[56] References Cited

U.S. PATENT DOCUMENTS

| | | | |
|---|---|---|---|
| 4,470,062 | 9/1984 | Muramatsu | 257/513 |
| 5,196,920 | 3/1993 | Kumamoto et al. | 257/798 |

FOREIGN PATENT DOCUMENTS

| | | | |
|---|---|---|---|
| 0214550 | 9/1986 | Japan | 257/659 |
| 0030470 | 2/1992 | Japan | 257/659 |

*Primary Examiner*—Robert P. Limanek
*Assistant Examiner*—David B. Hardy

[57] ABSTRACT

A circuit die 100 with improved substrate noise isolation may be achieved by providing a first circuit element 102 and a second circuit element 103 on a substrate 101. The first circuit element 102 generally injects noise into the substrate 101 while the second circuit element 103 is adversely affected by noise being carried in the substrate 101. To reduce the noise interference, a noise isolation ring 104–017 may be placed around the first circuit element 102 and/or the second circuit element 103 wherein the noise isolation ring is of a conducted material. A first lead 202 is electrically connected to a first circuit element 102, a second lead 205 is electrically connected to the second circuit element 103, and a third lead 201 is electrically connected to the noise isolation ring 105, wherein the third lead 201 is electrically isolated from both the first and second leads 202 and 205.

14 Claims, 3 Drawing Sheets

5,475,255

CIRCUIT DIE HAVING IMPROVED SUBSTRATE NOISE ISOLATION

TECHNICAL FIELD OF THE INVENTION

This invention relates generally to electrical noise suppression and, in particular, to noise suppression on circuit dies.

BACKGROUND OF THE INVENTION

Electrical circuits are known to include a plurality of circuit elements, wherein some of the circuit elements generate noise, while others are adversely affected by noise. Such noise generating circuits are generally digital type circuits such as transistors, random access memory (RAM) devices, read only memory (ROM) devices, line drivers, etc. Noise sensitive circuits are generally analog devices such as comparators, operational amplifiers, analog-to-digital converters, filters, bias circuits, voltage references, etc.

To limit noise interference between the noise generating circuits and the noise sensitive circuits, designers typically separate the "noisy" circuits (i.e. those that generate noise) from the noise sensitive circuits. To further reduce the noise interference, shielding may be placed around the noisiest circuits and/or around the noise sensitive circuits. The shielding is then coupled to a common line such as ground or a voltage source line.

This shielding technique has also been incorporated on circuit dies which are used in flip-chips, surface mount devices, and integrated circuits. Circuit die shielding improves noise isolation over non shielded techniques, but, when the noisy circuits, the noise sensitive circuits, the shielding, and the substrate all share the same common path on the circuit die, substrate noise still interferes with the performance of the noise sensitive circuit elements.

To further reduce noise interference on circuit dies, a first lead is provided on the circuit die for the substrate and another lead is provided for the shielding, the noisy circuit elements, and the noise sensitive circuit elements. The separate leads are connected, externally from the circuit die, to a common point such as system ground or a supply voltage. While this technique improves noise isolation over the single lead approach mentioned above, noise still affects the noise sensitive circuit elements. Therefore, a need exists for method and apparatus that further improves noise isolation on circuit dies.

DETAILED DESCRIPTION OF A PREFERRED EMBODIMENT

Generally, the present invention provides a method and apparatus for producing a circuit die that has improved substrate noise isolation. This is accomplished by providing a first circuit element and a second circuit element on a substrate. The first circuit element generally injects noise into the substrate, while the second circuit element is adversely affected by noise being carried in the substrate. To reduce the noise interference, a noise isolation ring may be placed around the first circuit element and/or the second circuit element, wherein the noise isolation ring is of a conductive material. With the noise isolation ring in place, a first lead is electrically connected to the first circuit element, a second lead is electrically connected to the second circuit element, and third lead is electrically connected to the noise isolation ring and is electrically isolated from both the first and second leads. With such a method and apparatus, substrate noise isolation is improved over prior art techniques.

Figure 1:
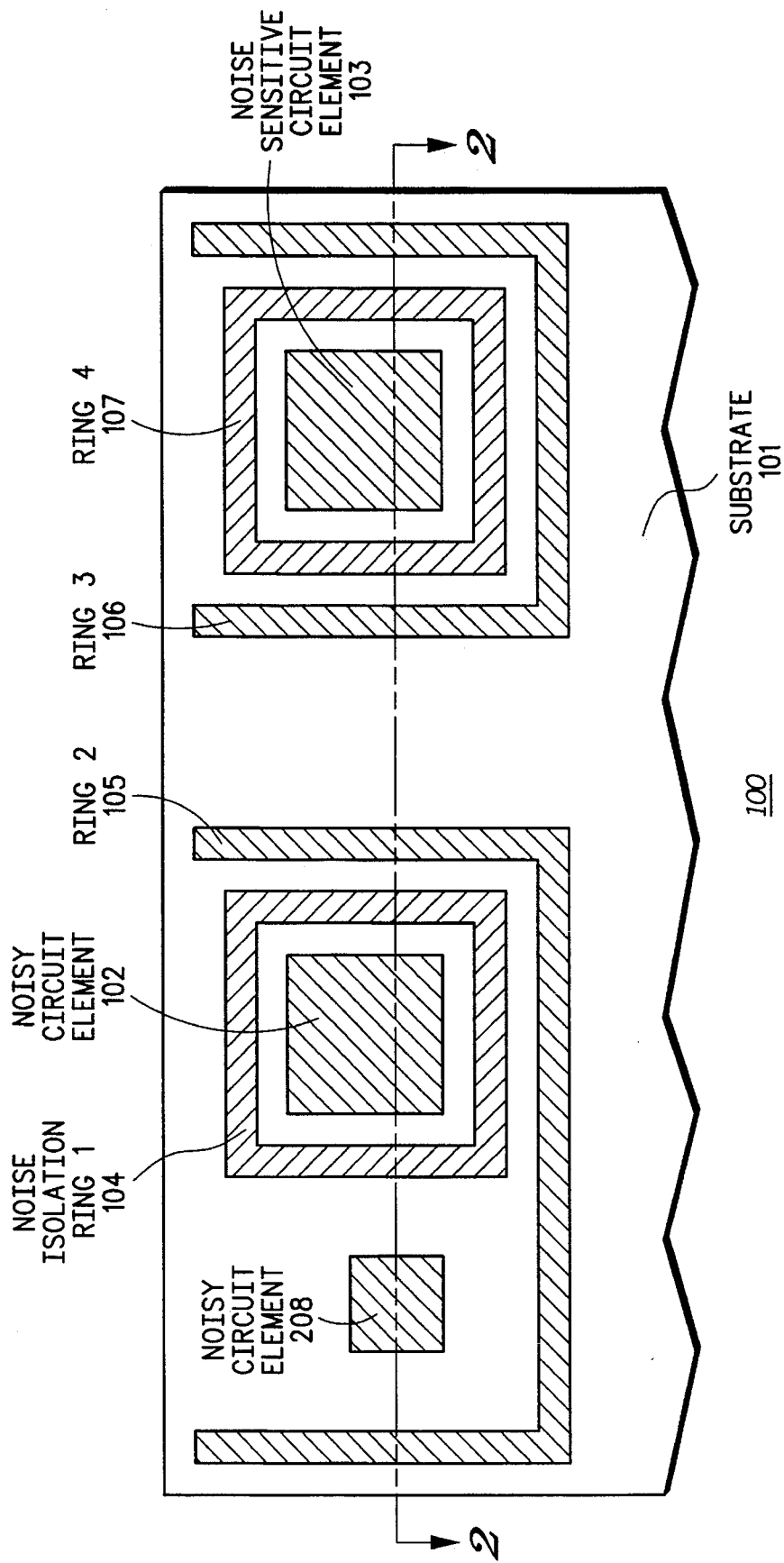
FIG. 1 illustrates a block diagram of a circuit die in accordance with the present invention.
Figure 2:
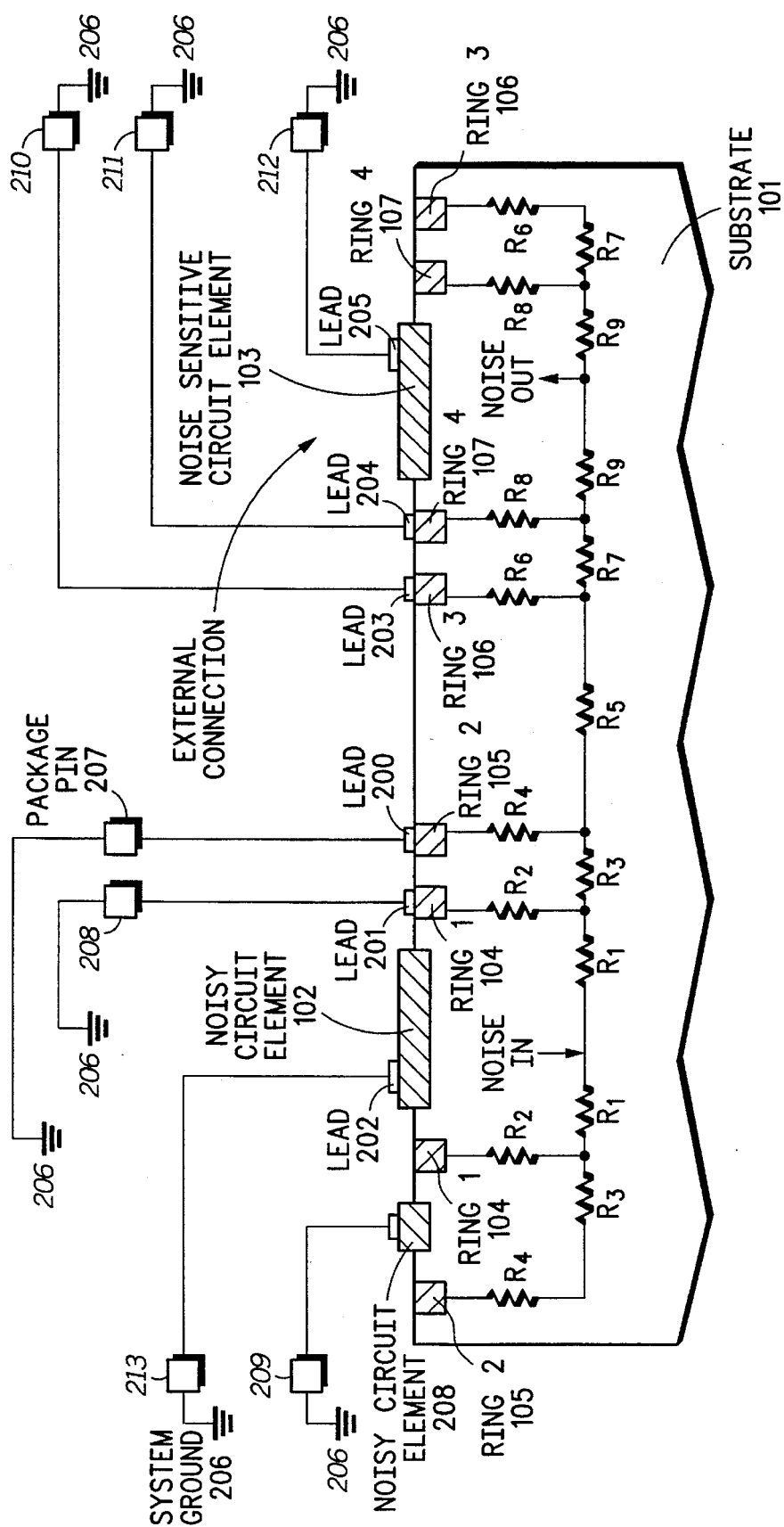
FIG. 2 illustrates a cross-sectional view and schematic representation of the circuit die of FIG. 1.

The present invention can be more fully described with reference to FIGS. 1–4. FIG. 1 and FIG. 2 illustrate a circuit die 100 that includes a substrate 101, a noisy circuit element 102, a noisy circuit element 208, a noise sensitive circuit element 103, and noise isolation rings 104–107, which are of the same material as the substrate 101. Note that, as shown, the noise isolation rings 104–107 either partially surround or completely surround the circuit elements. The substrate 101 may be comprised of a conductive material such as an n-type material or a p-type material which are commonly used for circuit die substrates. The noisy circuit element 102 may be any type of circuit which, when in operation, generates noise or injects noise into the substrate 101. For example, the noise circuit element 102 may be a transistor, a RAM, ROM, line driver, and/or bus drivers. While the noise sensitive circuit element 103 may be comprised of any circuit that is adversely affected by noise. Such circuits may be, for example, op-amps, phase lock loops, A-D converters, D-A converters, comparators, filters, voltage references, bias circuits, etc.

By positioning the noisy circuit element 102 and the noise sensitive circuit element 103 at predetermined locations on the substrate 101, noise isolation rings 104–107 may be placed around, or at least partially around, one or more of the circuit elements 102–103. For example, noisy circuit element 102 has been placed in the upper left hand corner, as shown, on the substrate 101. The first noise isolation ring 104 has been placed completely encircling or surrounding the noisy circuit element 102, while the second noise isolation ring 105 is partially surrounding, or encircling, the noisy circuit element 102. Similarly, the noise sensitive element 103 has a noise isolation ring 107 completely surrounding it and a noise isolation ring 106 partially surrounding it. While FIG. 1 illustrates both circuit elements 102 and 103 having noise isolation rings surrounding it, the present invention will provide desired noise isolation with having only one of the circuit elements 102–103 having only one noise isolation ring, or a partial isolation ring, surrounding it. Further, more than two isolation rings may be used, wherein the isolation rings may be of any geometric shape.

FIG. 2 illustrates a cross-sectional view of the circuit die of FIG. 1. As shown, the noisy circuit element 102 is at least partially surrounded by two isolation rings 104 and 105. Each of the isolation rings are connected to a lead 200 and 201, while the noisy circuit element 102 is also connected to a lead 202. Each of these leads 200–202 are provided on the substrate 101 of the circuit die 100 and are connected to separate package pins 207, 208, 213, respectively. The package pins 207, 208, 213 are then externally connected to a system ground 206. As is also shown, the noise sensitive element 103 is at least partially surrounded by noise isolation rings 106 and 107. The noise isolation rings 106 and 107 are connected to the leads 203–204, while the noise sensitive circuit element 103 is connected to lead 205. Each of these leads 203–205 are connected to a separate package pin 210–212, respectively, which are eternally connected to the system ground 206.

The package pins 207–213, which may be the pins of a flip-chip package, a surface mount package, or an integrated circuit package, are connected to the system ground 206 external to the circuit die 100. By making the lead 200–205 connections external to the circuit die 100, i.e., not on the circuit die 100 itself, noise isolation is improved over the prior art techniques that made such connections on the circuit die 100.

To illustrate the noise improvement, assume that the noisy circuit element 102 is an n-MOSFET and the noise sensitive circuit element 103 is a p-well contact, wherein the distance between the these elements 102–103 is approximately 100 µm. A baseline test was run without isolation rings, wherein the MOSFET was sourced with a 100 mV, 100 MHz signal. The results of the baseline test indicated that the noise rejection at the noise sensitive position was −24 dB at 100 MHz and −19 dB at 10 GHz. By adding an isolation ring around the MOSFET and the noise sensitive area, wherein the isolation rings are of the same material as the substrate, the noise rejection ratio improved to about −55 dB at 100 MHz and about −40 dB at 10 GHz. Further noise improvements may be achieved by minimizing the distance between the isolation ring and the noisy circuit element. For example, for the above test, an additional 10 dB of rejection can be obtained by reducing the distance between the ring and the noisy circuit from 40 µm to 10 µm.

Also shown in FIG. 2 are a plurality of impedance's that are designated with references R1–R9 and are inherent in the substrate structure. Impedance elements R1–R4, which include resistive and reactive components, create a complex network surrounding the noisy circuit element 102. The filtering capabilities of these impedance's R1–R4 may be varied by changing the impedance values of these elements. For example, by increasing the impedance value of R3 while decreasing the impedance value of R2 and R4, the noise suppression, or filtering of the R1–R4 network is improved. For example, R2 and R4 maybe reduced in value by increasing the width of the isolation rings 104 and 105. R3 may be increased in value by increasing the distance between isolation ring 104 and isolation ring 105. Likewise, the impedance elements R6–R9 surrounding the noise sensitive circuit elements comprise a complex filtering network. The R6–R9 filtering network operates in a similar manner as described above with reference to R1–R4. The two filtering networks R1–R4 and R6–R9 are coupled together via impedance R5. By increasing the value of R5, the coupling between the two filter networks is reduced, thus improving noise isolation. The impedance value of R5 maybe increased by increasing the distance between the isolation tings 105 and 106.

FIG. 2 further illustrates a second noisy circuit element 208 which is positioned between the first noise isolation ring 104 and the second noise isolation ting 105. Typically, the second noisy circuit element 208 will generate less noise than the first noisy circuit element 102, thus it can be placed between the tings 104 and 105. In practice, the circuits which generates the greatest noise should be placed in the inner most circle of the surrounding isolation tings while less noisy circuit elements can be placed between surrounding outer isolation rings. This technique is also applicable for the noise sensitive elements 103. Thus, the most noise sensitive circuit element should be in the center of the noise isolation rings while less noise sensitive circuits may be placed between the surrounding isolation rings.

Figure 3:
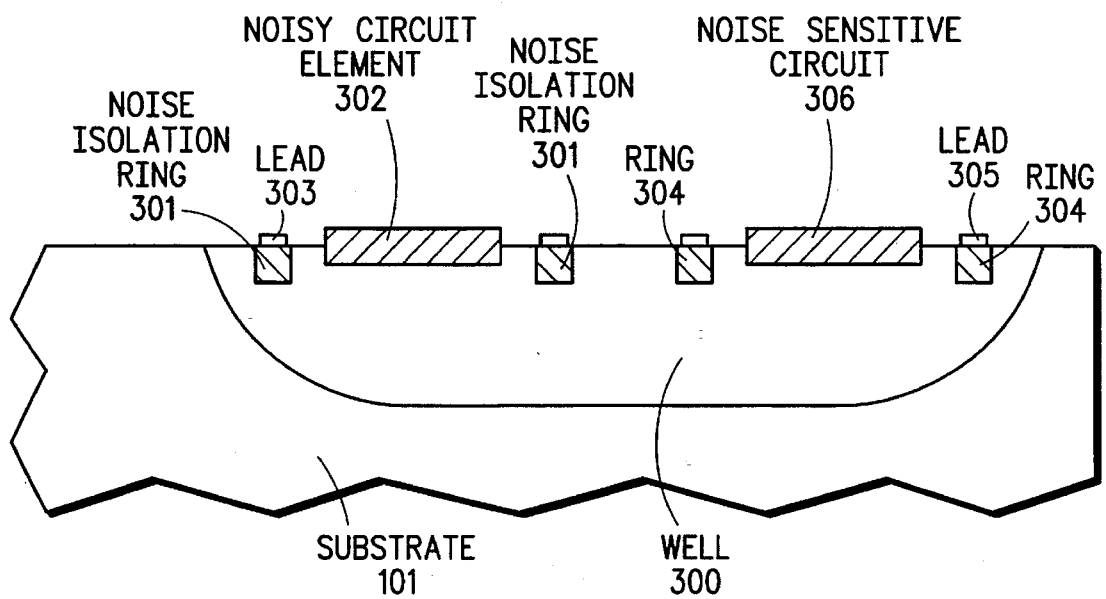
FIG. 3 illustrates an alternative embodiment of the circuit die of FIG. 1.

FIG. 3 illustrates an alternative embodiment of the circuit die 100 which includes the substrate 101 and a well 300. Shown on the well 300 is a noisy circuit element 302 and a noise sensitive circuit 306. Surrounding the noisy circuit element 302 is an isolation ring 300 which is coupled to lead 303. The noise sensitive circuit element 306 is surrounded by a noise isolation ting 304 which is connected to lead 305. The operation of the noise isolation ring in the well 300 is identical to that discussed above. The advantage of adding a well 300, which is of an opposite conductive material than that of the substrate, provides further noise isolation for the elements on the well 300. While FIG. 3 illustrates both a noisy circuit element 302 and a noise sensitive element 303 shown within the well 300, it should be readily understood by one skilled in me art that either a noisy circuit element 302 or a noise sensitive circuit element 306 may be the only element on the well 300.

Figure 4:
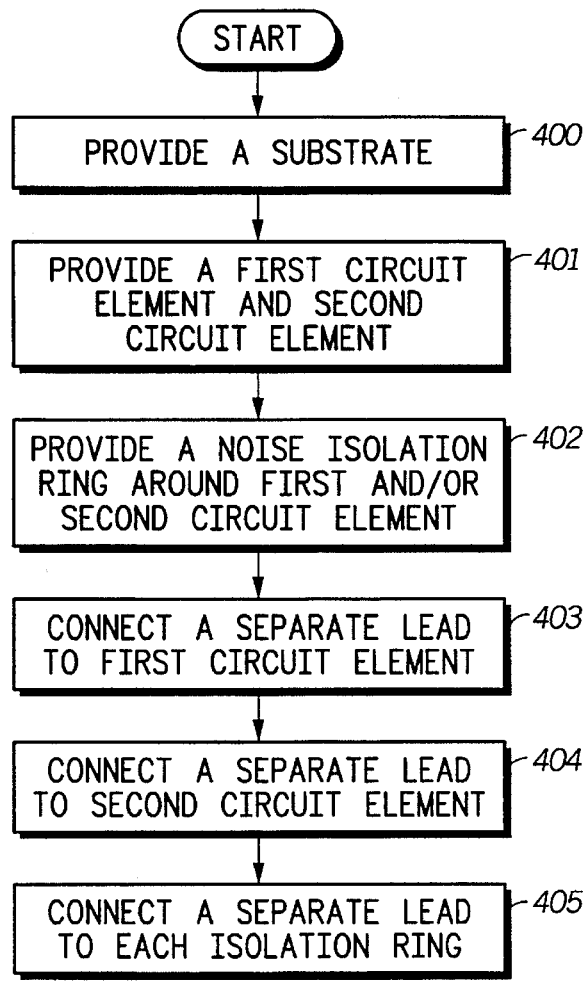
FIG. 4 illustrates a logic diagram that may be used to implement the present invention.

FIG. 4 illustrates a logic diagram for implementing, or fabricating a circuit die 100 which incorporates the present invention. The fabrication techniques that may be used include CMOS, BiPolar, BiCMOS, and Gallium Arsenide techniques, or any resistant type substrate techniques. The process begins at 400 where a substrate is provided. Given the substrate 400, a first circuit element and a second circuit element are deposited on the substrate 401. As mentioned above the first circuit element generally is of the type that produces noise while the second circuit element is of the type that it is noise sensitive. Having deposited the first and second circuit elements on the substrate 401, a noise isolation ring is provided around the first circuit element and/or the second element 402. It is a designer's choice, based upon the noise requirements and real estate available, as to whether to use one isolation ring around one circuit element or a plurality of isolation rings around a plurality of circuit elements.

After depositing the first and second circuits elements, and the noise isolation rings, a separate lead is connected to each isolation ring and each of the first and second circuit elements 403–405. Once the circuit die is fabricated, the separate leads are connected external from the circuit die to provide a common connection. The common external connection will be coupled to a system ground if the substrate is of a p-type material and coupled to a supply voltage if the substrate is of an n-type material.

The present invention provides a method and apparatus for producing a circuit die which has improved substrate noise isolation. This is accomplished by providing separate leads for each noise sensitive circuit and each noise generating circuit while also providing separate leads for each noise isolation ring that surrounds the noise sensitive or noise generating circuits. This provides an advantage over prior art technique which only provided a separate lead for the substrate and a common lead for the noise sensitive and noise generating circuits.

We claim:

1. A circuit die having improved substrate noise isolation, the circuit die comprising:

a substrate;

a first circuit element deposited on the substrate, wherein the first circuit element, when in operation, injects noise carriers into the substrate;

a second circuit element deposited on the substrate, wherein operation of the second circuit element is adversely effected by the noise carriers;

a first noise isolation ring that at least partially surrounds the first circuit element, wherein the noise isolation ring is of a conductive material;

a first lead electrically connected to the second circuit element;

a second lead electrically connected to the second circuit element;

a third lead electrically connected to the nose isolation ring, wherein the third lead is electrically isolated from the first lead and the second lead;

a second noise isolation ring that at least partially surrounds the first noise isolation ring, wherein the second noise isolation ring is of the conductive material; and a fourth lead electrically connected to the second noise isolation ring, wherein the fourth lead is electrically isolated from the first lead, the second lead, and the third lead.

2. The circuit die of claim 1 further comprises a third circuit element deposited on the substrate between the first noise isolation ring and the second noise isolation ring, wherein the third circuit element injects at least a portion of the noise carriers into the substrate.

3. The circuit die of claim 1, wherein the conductive material is a P-type material, wherein the first lead and the second lead are coupled to a first package pin and a second package pin, respectively, wherein the first package pin and the second package pin are external to the circuit die such that, when externally connected, the first package pin and the second package pin couple the first circuit element and the second circuit element, respectively, to a return, and wherein the third lead is coupled to a third package pin external to the circuit die such that, when externally connected, the third package pin couples the first noise isolation ring to the return.

4. The circuit die of claim 1, wherein the conductive material is a N-type material, wherein the first lead and the second lead are coupled to a first package pin and a second package pin, respectively, wherein the first package pin and the second package pin are external to the circuit die such that when externally connected, the first package pin and the second package pin couple the first circuit element and the second circuit element, respectively, to a supply, and wherein the third lead is coupled to a third package pin external to the circuit die such that, when externally connected, the third package pin couples the first noise isolation ring to the supply.

5. The circuit die of claim 1, wherein the substrate further includes a well of opposite conductive material.

6. The circuit die of claim 5 further comprises:

a third circuit element that is deposited in the well, wherein the third circuit element, when in operation, injects at least a portion of the noise carriers into the well;

a second noise isolation ring that at least partially surrounds the third circuit element, wherein the second noise isolation ring is of the opposite conductive material;

a fourth lead electrically connected to the third circuit element;

a fifth lead electrically connected to the second noise isolation ring, wherein the fifth lead is electrically isolated from the fourth lead.

7. A circuit die having improved substrate noise isolation, the circuit die comprising:

a substrate;

a first circuit element deposited on the substrate, wherein the first circuit element, when in operation, injects noise carriers into the substrate;

a second circuit element deposited on the substrate, wherein operation of the second circuit element is adversely effected by the noise carriers;

a first noise isolation ring that at least partially surrounds the first circuit element, wherein the noise isolation ring is of a conductive material;

a first lead electrically connected to the first circuit element;

a second lead electrically connected to the second circuit element;

a third lead electrically connected to the noise isolation ring, wherein the third lead is electrically isolated from the first lead and the second lead;

a second noise isolation ring that at least partially surrounds the second circuit element; and a fourth lead electrically connected to the second noise isolation ring, wherein the fourth lead is electrically isolated from the first lead, the second lead, and the third lead.

8. The circuit die of claim 7, wherein the conductive material is a P-type material, wherein the first lead and the second lead are coupled to a first package pin and a second package pin, respectively, wherein the first package pin and the second package pin are external to the circuit die such that when externally connected, the first package pin and the second package pin couple the first circuit element and the second circuit element, respectively, to a return, and wherein the third lead is coupled to a third package pin external to the circuit die such that when externally connected, the third package pin couples the first noise isolation ring to the return.

9. The circuit die of claim 7, wherein the conductive material is a N-type material, wherein the first lead and the second lead are coupled to a first package pin and a second package pin, respectively, wherein the first package pin and the second package pin are external to the circuit die such that when externally connected, the first package pin and the second package pin couple the first circuit element and the second circuit element, respectively, to a supply, and wherein the third lead is coupled to a third package pin external to the circuit die such that when externally connected, the third package pin couples the first noise isolation ring to the supply.

10. A circuit die having improved substrate noise isolation, the circuit die comprising:

a substrate;

a first circuit element deposited on the substrate, wherein the first circuit element, when in operation, injects noise carriers into the substrate;

a second circuit element deposited on the substrate, wherein operation of the second circuit element is adversely effected by the noise carriers;

a first noise isolation ring that at least partially surrounds the first circuit element, wherein the noise isolation ring is of a conductive material;

a first lead electrically connected to the first circuit element;

a second lead electrically connected to the second circuit element;

a third lead electrically connected to the noise isolation ring, wherein the third lead is electrically isolated from the first lead and the second lead;

a well of opposite conductive material deposited on the substrate;

a third circuit element that is deposited in the well, wherein the third circuit element, when in operation, injects at least a portion of the noise carriers into the well;

a second noise isolation ring that at least partially surrounds the third circuit element and is deposited in the well, wherein the second noise isolation ring is of the opposite conductive material;

a fourth lead electrically connected to the third circuit element;

a fifth lead electrically connected to the second noise isolation ring, wherein the fifth lead is electrically isolated from the fourth lead.

11. A circuit die having improved substrate noise isolation, the circuit die comprising:

a substrate;

a first circuit element deposited on the substrate, wherein the first circuit element, injects noise carriers into the substrate;

a second circuit element deposited on the substrate, wherein the operation of the second circuit element is adversely effected by the noise carriers;

a first noise isolation ring that at least partially surrounds the second circuit element, wherein the first noise isolation ring is of a conductive material;

a first lead connected to the first circuit element;

a second lead connected to the second circuit element;

a third lead connected to the first noise isolation ring, wherein the third lead is electrically isolated from the first lead and the second lead;

a second noise isolation ring that at least partially surrounds the first noise isolation ring, wherein the second noise isolation ring is of the conductive material; and a fourth lead electrically connected to the second noise isolation ring, wherein the fourth lead is electrically isolated from the first lead, the second lead, and the third lead.

12. The circuit die of claim 11, wherein the conductive material is a P-type material, wherein the first lead and the second lead are coupled to a first package pin and a second package pin, respectively, wherein the first package pin and the second package pin are external to the circuit die such that when externally connected, the first package pin and the second package pin couple the first circuit element and the second circuit element, respectively, to a return, and wherein the third lead is coupled to a third package pin external to the circuit die such that when externally connected, the third package pin couples the first noise isolation ring to the return.

13. The circuit die of claim 11, wherein the conductive material is a N-type material, wherein the first lead and the second lead are coupled to a first package pin and a second package pin, respectively, wherein the first package pin and the second package pin are external to the circuit die such that when externally connected, the first package pin and the second package pin couple the first circuit element and the second circuit element, respectively, to a supply, and wherein the third lead is coupled to a third package pin external to the circuit die such that when externally connected, the third package pin couples the first noise isolation ring to the supply.

14. A circuit die having improved substrate noise isolation, the circuit die comprising:

a substrate;

a first circuit element deposited on the substrate, wherein the first circuit element, when in operation, injects noise carriers into the substrate;

a second circuit element deposited on the substrate, wherein operation of the second circuit element is adversely effected by the noise carriers;

a first noise isolation ring that at least partially surrounds the first circuit element, wherein the noise isolation ring is of a conductive material;

a first lead electrically connected to the first circuit element;

a second lead electrically connected to the second circuit element;

a third lead electrically connected to the noise isolation ring, wherein the third lead is electrically isolated from the first lead and the second lead;

a well of opposite conductive material deposited on the substrate;

a third circuit element deposited in the well, wherein operation of the third circuit element is adversely effected by the noise carriers;

a second noise isolation ring that at least partially surrounds the third circuit element and is deposited in the well, wherein the second noise isolation ring is of the opposite conductive material;

a fourth lead electrically connected to the third circuit element; and a fifth lead electrically connected to the second noise isolation ring, wherein the fifth lead is electrically isolated from the fourth lead.

* * * * *

UNITED STATES PATENT AND TRADEMARK OFFICE
CERTIFICATE OF CORRECTION

PATENT NO. : 5,475,255  Page 1 of 1
APPLICATION NO. : 08/268744
DATED : December 12, 1995
INVENTOR(S) : Kuntal Joardar et al.

It is certified that error appears in the above-identified patent and that said Letters Patent is hereby corrected as shown below:

In Column 5, Line 1, Claim No. 1:
        Change "second" to --first--

In Column 5, Line 5, Claim No. 1:
        Change "nose" to --noise--

Signed and Sealed this

Thirteenth Day of April, 2010

David J. Kappos
*Director of the United States Patent and Trademark Office*